United States Patent [19]

Takubo et al.

[11] Patent Number: 5,448,451
[45] Date of Patent: Sep. 5, 1995

[54] LEAD CARRIER

[75] Inventors: Chiaki Takubo, Yokohama; Kimihiro Ikebe, Urayasu; Masafumi Takeuchi, Tokyo; Seiichi Hirata, Yokosuka; Sumio Takeda, Yokohama, all of Japan

[73] Assignee: Kabushiki Kaisha Toshiba, Kawasaki, Japan

[21] Appl. No.: 154,442

[22] Filed: Nov. 19, 1993

[30] Foreign Application Priority Data

Nov. 20, 1992 [JP] Japan .................................. 4-312034

[51] Int. Cl.⁶ .............................................. H05K 1/00
[52] U.S. Cl. ..................................... 361/749; 361/776; 361/777; 361/813; 257/672; 257/668; 174/261; 439/67
[58] Field of Search ............... 361/749, 772, 776, 777, 361/813, 749; 287/666, 672, 668, 676; 174/254, 255, 261, 268; 439/67, 68, 77

[56] References Cited

U.S. PATENT DOCUMENTS 3,818,279  6/1974  Seeger, Jr. et al. .......... 317/101 CM

FOREIGN PATENT DOCUMENTS 1-119034  5/1979  Japan .
2-230749  9/1990  Japan .
4-144142  5/1992  Japan .
4144142   5/1992  Japan .

Primary Examiner—Leo P. Picard
Assistant Examiner—Young Whang
Attorney, Agent, or Firm—Finnegan, Henderson, Farabow, Garrett & Dunner

[57] ABSTRACT

Two device holes are formed in a base film such that the device holes are juxtaposed in a width direction of the base film perpendicular to a feed direction of the base film. An outer lead hole is formed in the base film with a distance from the device holes in the feed direction. A first lead wire group is arranged on the base film between the outer lead hole and one of the device holes, and a second lead wire group is arranged on the base film between the outer lead hole and the other device hole. Further, a third lead wire group is arranged on the base film between both device holes.

13 Claims, 9 Drawing Sheets

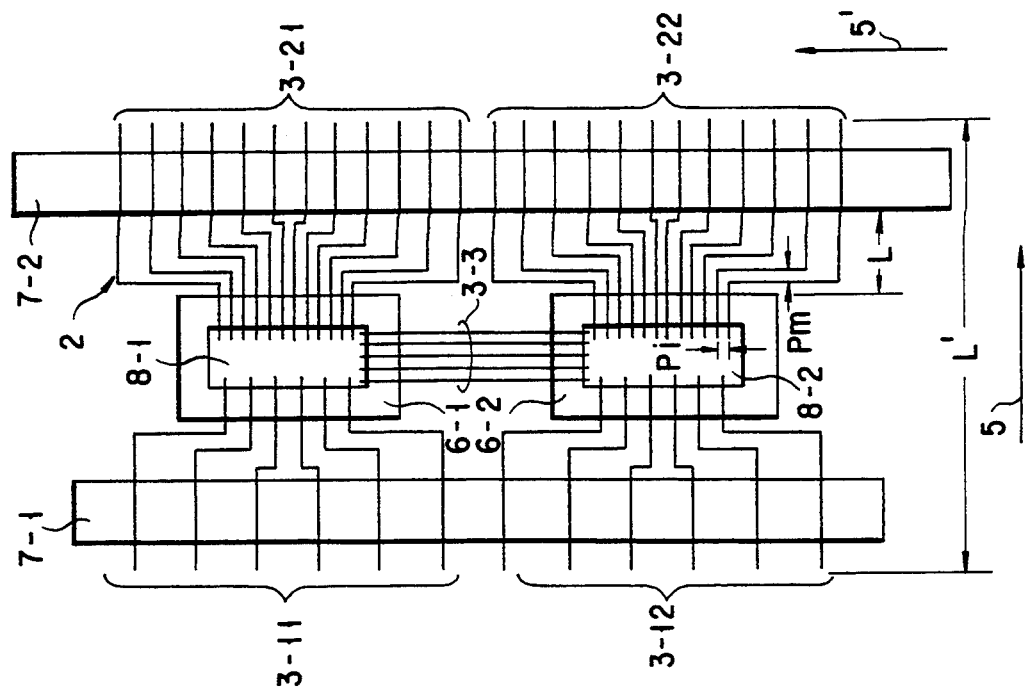
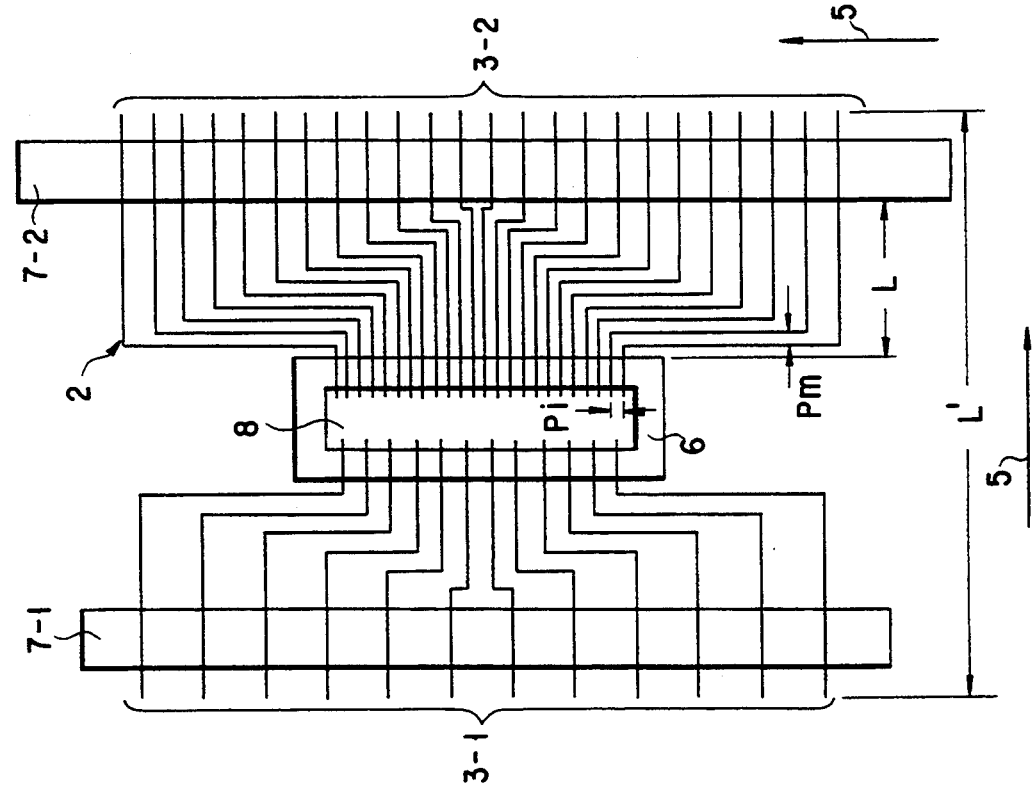

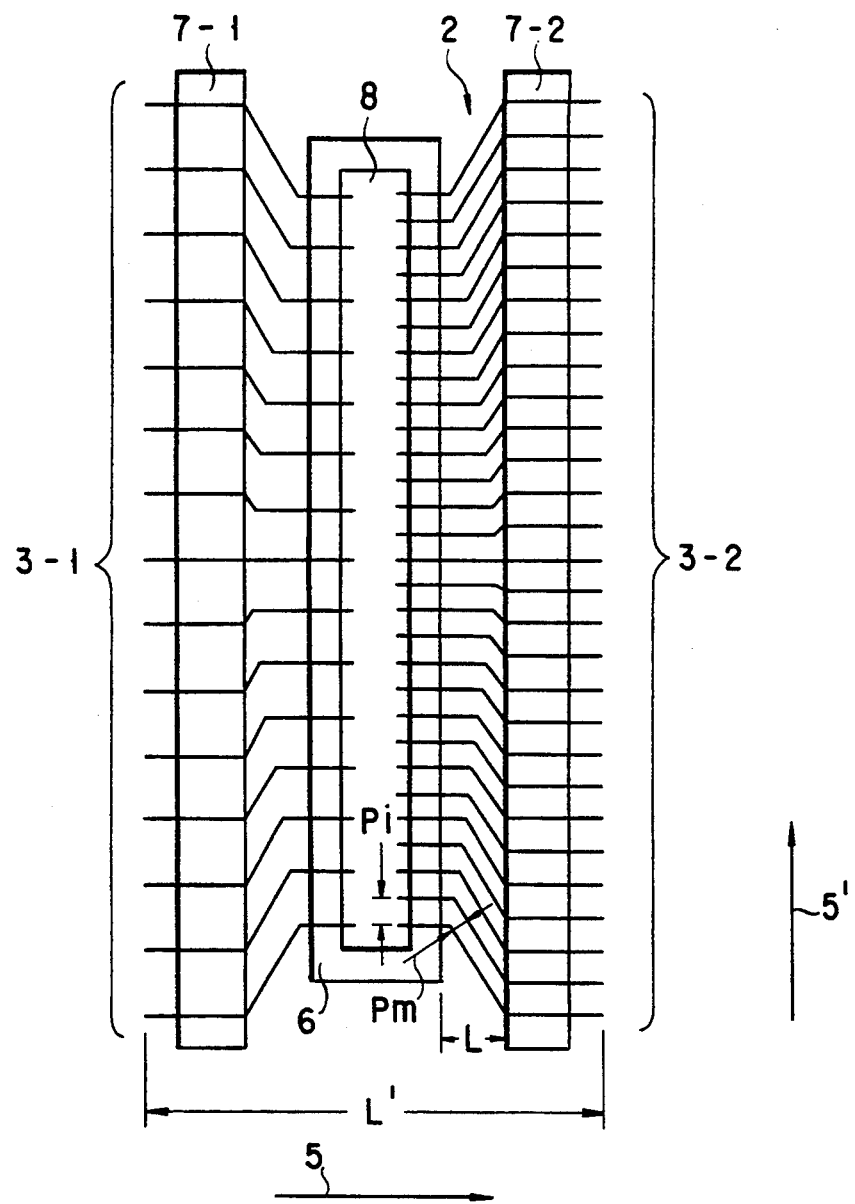
F I G. 11

LEAD CARRIER

BACKGROUND OF THE INVENTION

1. Field of the Invention

The present invention relates to lead carriers such as a lead frame and a film carrier tape used for semiconductor integrated circuit (IC) devices.

2. Description of the Related Art

In the following description, lead frames used for typical semiconductor IC devices and film carrier tapes (often called "TAB tape") used for semiconductor IC devices fabricated by tape automated bonding (TAB) are generally referred to as "lead carriers."

In general, a film carrier tape, on which a liquid crystal display (LCD) driver chip is mounted, is provided with an input-side outer lead hole in which an input signal lead wire group is situated, a device hole in which the chip is situated, and an output-side outer lead hole in which an output signal lead wire group is situated. These holes are located in this order in the direction of tape feed. One end portion of the lead wire is electrically connected to the LCD driver chip. The other end portion of the lead wire serves as an input terminal of the chip in the case where the lead wire is one for input signals, or serves as an output terminal of the chip where it is one for output signals. The said one end portion is called "inner lead", and the other end portion is called "outer lead."

The number of input-signal lead wires of the LCD chip is 20 to 50, whereas the number of output-signal lead wires is 160 or more. The number of output-signal lead wires has been increasing more and more, with development of functions of devices. The problem is the increase in number of output-signal lead wires.

When lead wires are formed on a base film, a minimum wiring pitch is determined for the purpose of accuracy for processing. The minimum pitch between lead wires differs between the inner-lead side and the outer-lead side. In general, the pitch on the inner-lead side is small, and the pitch on the outer-lead side is large. Accordingly, the pitch between lead wires is small in the device hole, and it is large in the outer lead hole.

In order to form lead wires having different pitches between both-side portions thereof with an integrated conductor pattern, it is necessary to form the conductor pattern in a-fan-shaped manner on base film portions between the device hole and outer lead holes. For this purpose, a distance L is provided between the device hole and outer lead hole in accordance with the number of lead wires, thus keeping regions for forming the fan-shaped conductor pattern. However, if the number of lead wires increases, it is necessary to increase the area for forming the fan-shaped conductor pattern, i.e. the distance L between the device hole and outer lead hole.

The distance L increases substantially in proportion to the increase in number of lead wires. In other words, if only the number of output signal lines increases with the pitch unchanged, the distance L increases gradually.

If the distance L increases, the device region necessary for one device increases. As a result, the amount of film necessary for one device increases, and the yield of devices per film tape reel decreases. Thus, the manufacturing cost of devices increases.

SUMMARY OF THE INVENTION

The present invention has been made in consideration of the above circumstances, and its object is to provide a lead carrier, which can decrease the amount of a base member required for one device, thereby reducing the manufacturing cost of devices.

In order to achieve the above object, there is provided a lead carrier comprising: a base member having a predetermined feed direction and a predetermined width direction perpendicular to the feed direction; at least two first and second electronic part arrangement portions defined in the base member such that the at least two first and second electronic part arrangement portions are juxtaposed in the width direction; a conductor pattern arrangement portion defined in the base member such that the conductor pattern is distanced from the first and second electronic part arrangement portions in the feed direction; a first lead wire group defined on the base member between the first electronic part arrangement portion and the conductor pattern arrangement portion; a second lead wire group defined on the base member between the second electronic part arrangement portion and the conductor pattern arrangement portion; and a third lead wire group defined on the base member between the first electronic part arrangement portion and the second electronic part arrangement portion.

According to the lead carrier of the structure, at least two first and second electronic part arrangement portions are defined such that these arrangement portions are juxtaposed in the base member in the width direction. A conductor pattern arrangement portion is defined in the base member with a distance from the first and second electronic part arrangement portions in the feed direction. First and second lead wire groups are arranged, respectively between the conductor pattern and the first electronic part arrangement portion and between the conductor pattern and the second electronic part arrangement portion.

Since the lead wire group, which has conventionally been a single group, is divided into at least two wire groups, the number of lead wires arranged between one of the electric part arrangement portion and the conductor pattern arrangement portion can be reduced.

If the number of lead wires arranged between the electric part arrangement portion and the conductor pattern arrangement portion is reduced, the distance between the electric part arrangement portion and the conductor pattern arrangement portion is reduced and the length in the feed direction required by one device can be reduced.

Since the length in the feed direction is reduced, the amount of base member used by one device decreases and the yield of devices per tape reel increases. Therefore, the manufacturing cost of devices can be reduced.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 5A and FIG. 5B are enlarged views each showing one of device regions of tape;

FIG. 11 is an enlarged view of one of device regions of the tape according to another comparison example of the invention.

DETAILED DESCRIPTION OF THE PREFERRED EMBODIMENTS

Figure 1:
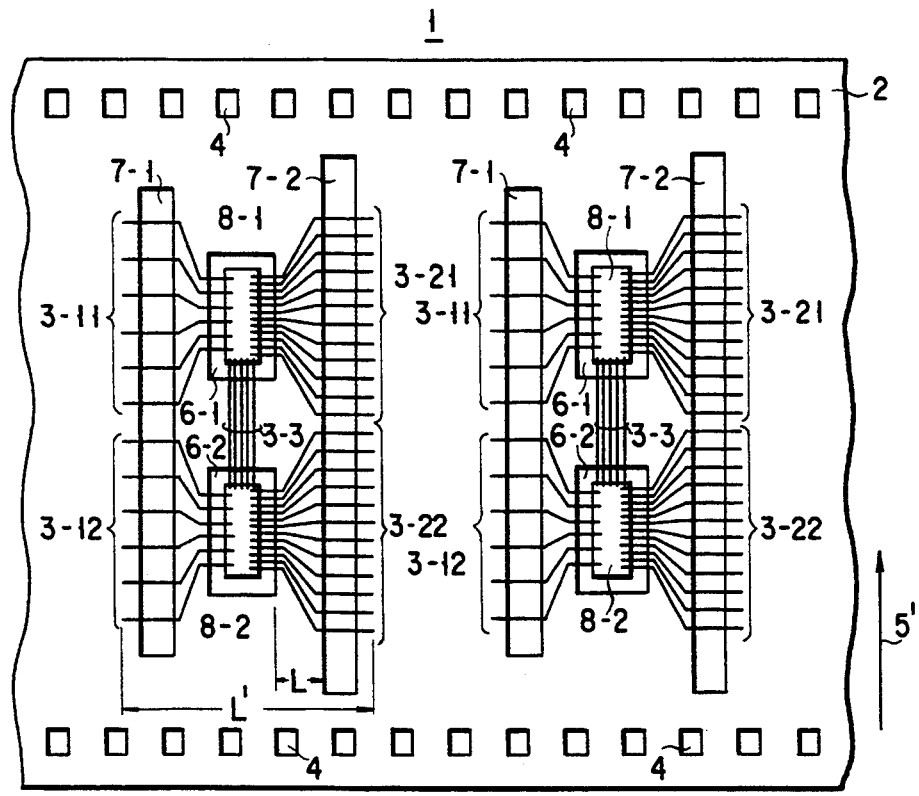
FIG. 1 is a plan view of a film carrier tape according to a first embodiment of the present invention.

Embodiments of the present invention will now be described with reference to the accompanying drawings. In the drawing, like elements are identified with like reference numerals, and a description of common parts is omitted.

FIG. 1 is a plan view of a film carrier tape according to a first embodiment of the present invention. The film carrier tape shown in FIG. 1 is used for mounting of, in particular, an LCD driver chip for driving a liquid crystal (LC) panel.

As is shown in FIG. 1, the elongated film carrier tape 1 includes a tape-like base film 2 which is made of an electrically insulating material. Sprocket perforations 4 are formed in both side edge portions of the base film 2 which are opposed to each other. Feed claws provided on a sprocket roller (not shown) for feeding the base film 2 are engaged in the sprocket perforations 4. By rotating the sprocket roller, the base film 2 is fed in a direction indicated by arrow 5 ("feed direction 5"). The direction perpendicular to the feed direction 5 is referred to as "width direction 5'".

The base film 2 has a first device hole 6-1 and a second device hole 6-2 arranged in the width direction 5' and also has an input-side outer lead hole 7-1 and an output-side outer lead hole 7-2 arranged in the feed direction 5 and distanced from the first and second device holes 6-1 and 6-2. The input-side lead hole 7-1, the first and second device holes 6-1 and 6-2, and the output-side lead hole 7-2 are located in the feed direction 5 in this order.

A first input signal lead wire group 3-11 is arranged on the base film 2 between the first device hole 6-1 and input-side outer lead hole 7-1, and a second input signal lead wire group 3-12 is arranged on the base film 2 between the second device hole 6-2 and input-side outer lead hole 7-1. The first and second input signal lead wire groups 3-11 and 3-12 extend in the feed direction 5 and are arranged in columns in the width direction 5'.

Similarly, a first output signal lead wire group 3-21 is arranged on the base film 2 between the first device hole 6-1 and output-side outer lead hole 7-2, and a second output signal lead wire group 3-22 is arranged on the base film 2 between the second device hole 6-2 and output-side outer lead hole 7-2. The first and second output signal lead wire groups 3-21 and 3-22 extend in the feed direction 5 and are arranged in columns in the width direction 5'.

In addition, a chip connection lead wire group 3-3 is arranged on the base film 2 between the first device hole 6-1 and second device hole 6-2. The chip connection lead wire group 3-3 extends in the width direction 3-3 and is arranged in a column in the feed direction 5.

One end portion of the first input signal lead wire group 3-11 is projected over the first device hole 6-1, and the other end portion thereof extends to the base film 2 beyond the input-side outer lead hole 7-1. One end portion of the second input signal lead wire group 3-12 is projected over the second device hole 6-2, and the other end portion thereof extends to the base film 2 beyond the input-side outer lead hole 7-1.

Similarly, one end portion of the first output signal lead wire group 3-21 is projected over the first device hole 6-1, and the other end portion thereof extends to the base film 2 beyond the output-side outer lead hole 7-2. One end portion of the second output signal lead wire group 3-22 is projected over the second device hole 6-2, and the other end portion thereof extends to the base film 2 beyond the output-side outer lead hole 7-2.

One end portion of the chip connection lead wire group 3-3 is projected over the first device hole 6-1, and the other end portion thereof is projected over the second device hole 6-2.

The aforementioned one end portion of the first input lead wire group 3-11 projected over the first device hole 6-1 is a connecting portion for connection with a first LCD driver chip 8-1, and the other end portion thereof functions as input terminal wire portion of the first LCD driver chip 8-1. The aforementioned one end portion of the second input lead wire group 3-12 projected over the second device hole 6-2 is a connecting portion for connection with a second LCD driver chip 8-2, and the other end portion thereof functions as input terminal wire portion of the second LCD driver chip 8-2.

Similarly, the aforementioned one end portion of the first output lead wire group 3-21 projected over the first device hole 6-1 is a connecting portion for connection with the first LCD driver chip 8-1, and the other end portion thereof functions as output terminal wire portion of the first LCD driver chip 8-1. The aforementioned one end portion of the second output lead wire group 3-22 projected over the second device hole 6-2 is a connecting portion for connection with the second LCD driver chip 8-2, and the other end portion thereof functions as output terminal wire portion of the second LCD driver chip 8-2.

There is a case where the first and second output lead wire groups 3-21 and 3-22 may include power supply wires, control signal wires, etc., in addition to output signal wires.

The end portion of the chip connection lead wire group 3-3 projected over the first device hole 6-1 is connected to the first LCD driver chip 8-1, and the other end portion thereof projected over the second device hole 6-2 is connected to the second LCD driver chip 8-2.

Rectangular LCD driver chips 8-1 and 8-2 are situated within the device holes 6-1 and 6-2. Each pair of LCD driver chips 8-1 and 8-2 functions as a single LCD driver chip. Each pair of LCD driver chips 8-1 and 8-2 are electrically connected to each other by the lead wire group 3-3 extending in the width direction 5', thereby effecting the function of the LCD driver.

These lead wire groups 3-11, 3-12, 3-21, 3-22 and 3-3 are electrically connected to corresponding electrode pads (not shown) formed on the chips 8-1 and 802 by means of TAB (Tape Automated Bonding).

Since FIG. 1 is a schematic plan view, the number of pins (lead wires), the pitch of sprocket perforations, etc. are different from the actual ones.

Figure 2:
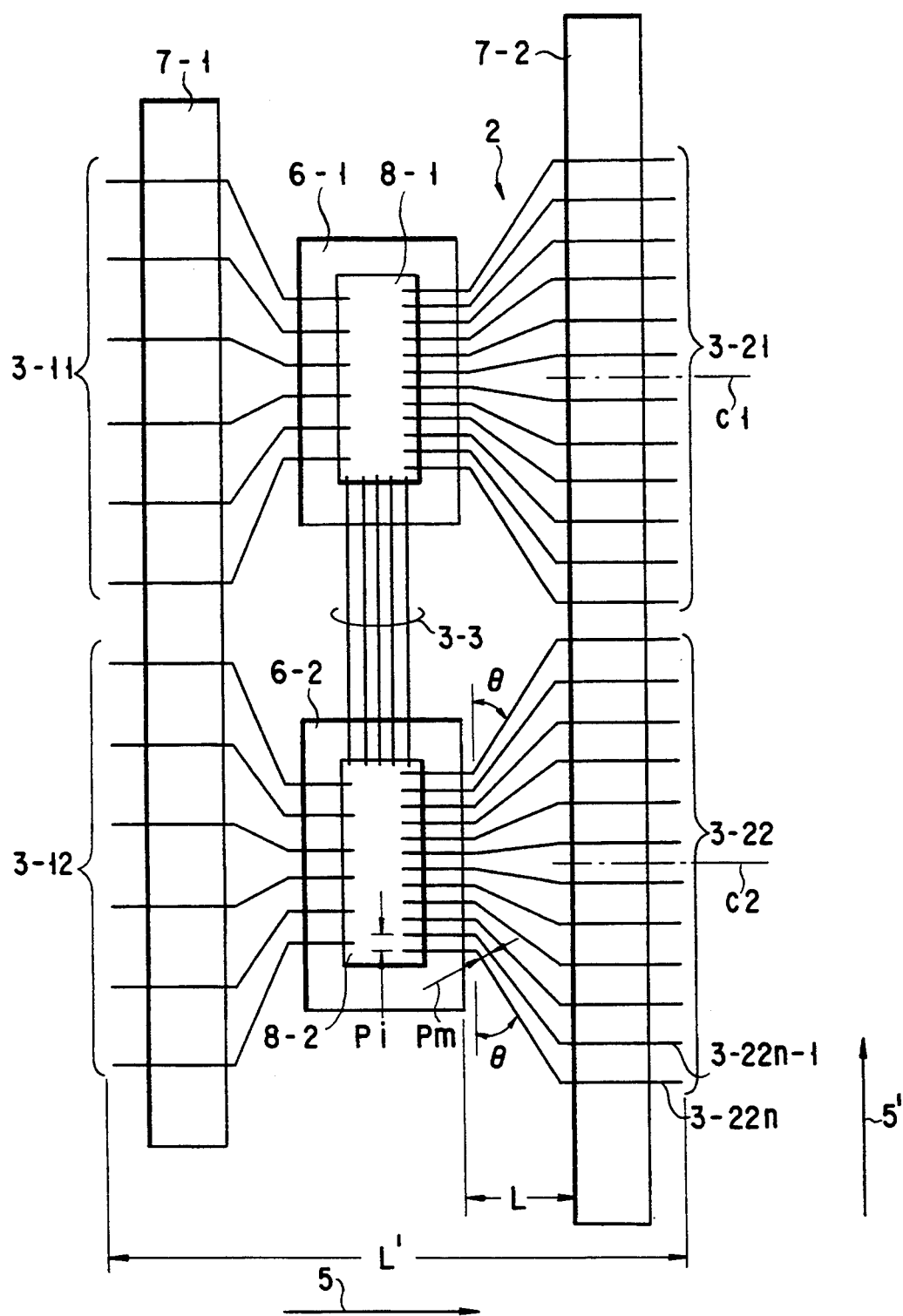
FIG. 2 is an enlarged view of one of device regions of the tape shown in FIG. 1.

FIG. 2 is an enlarged view of one of device regions of the tape shown in FIG. 1.

As is shown in FIG. 2, in the first embodiment, the first lead wire group 3-21 extends towards the outer lead hole 7-2 in a flaring fashion with respect to a center line C1 of the wire group 3-21.

Similarly, the second lead wire group 3-22 extends towards the outer lead hole 7-2 in a flaring fashion with respect to a center line C2 of the wire group 3-22.

Accordingly, the pitch Pm between the outermost lead wire 3-22n and lead wire 3-22n-1 is most strict. In the first embodiment, the pitch Pm is set at a minimum wiring pitch allowable from the standpoint of processing accuracy.

In the film carrier tape 1 shown in FIGS. 1 and 2, since two devices holes 6-1 and 6-2 are provided, the number of lead wires to be arranged between one device hole and one outer lead hole is reduced. Accordingly, in the first embodiment, the number of lead wires to be arranged in a fan-shaped region defined by an opening angle θ the outermost lead wire can be reduced. If the number of lead wires to be arranged in a fan-shaped region can be reduced, the distance L between the device hole and outer lead hole can also be reduced.

The advantage of the reduction in distance L can also be obtained with respect to the input signal lead wire groups 3-11 and 3-12.

According to the first embodiment, the distance L between the device hole and outer lead hole can be reduced, and the length L' in the feed direction 5, which is required by one device on the tape 1, can be decreased. Thus, the amount of film required for each device can be decreased, and the device yield per tape reel can be increased. Therefore, the manufacturing cost of devices can be reduced.

Figure 10:
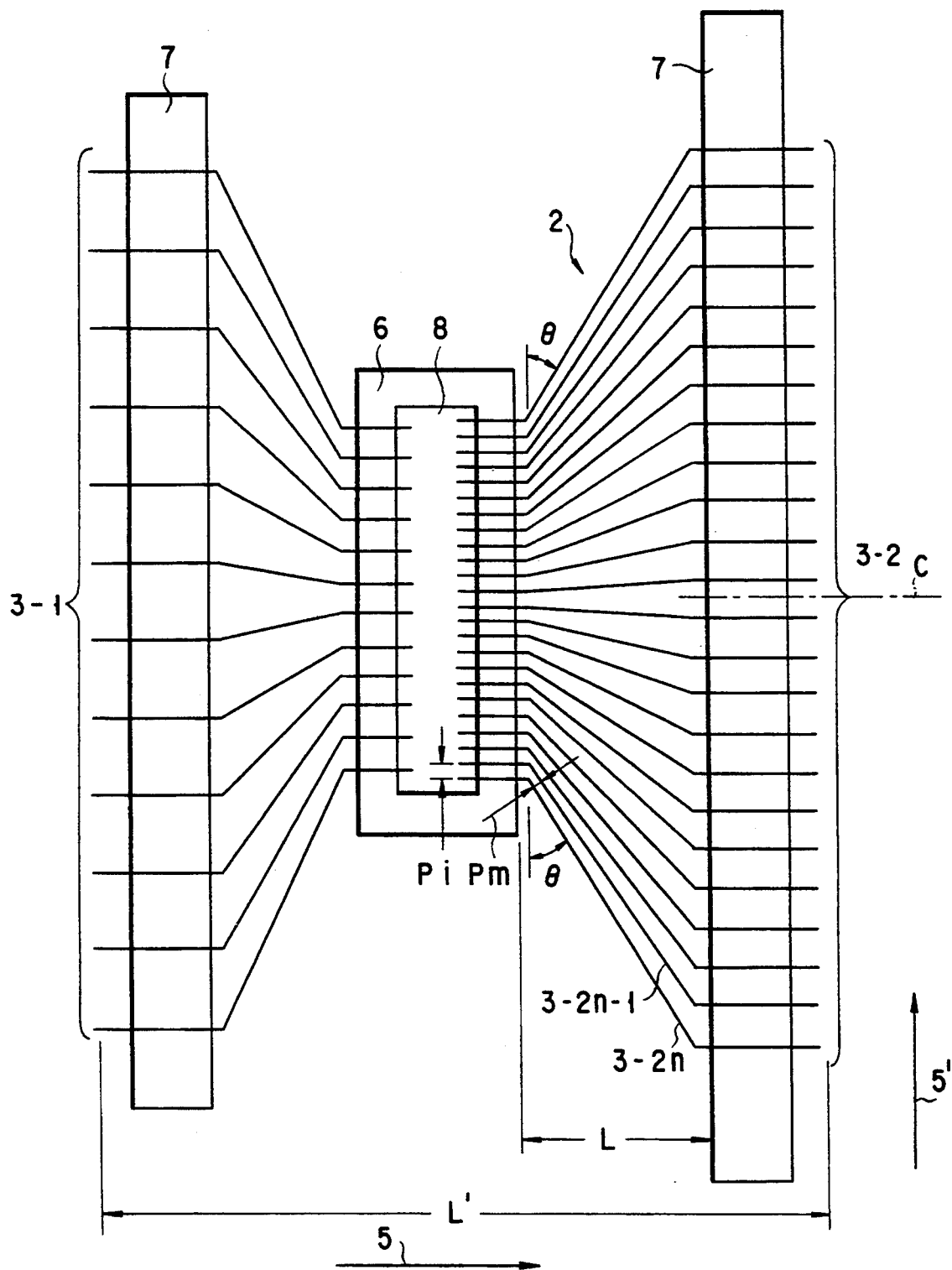
FIG. 10 is a plan view of a film carrier tape according to a comparison example of the invention.

In the first embodiment, the length L' in the feed direction required by each device could be reduced down to about 74%, for example, as compared to a tape carrier film shown in FIG. 10.

FIG. 10 is a plan view of a film carrier tape according to an example of the invention, as compared to the first embodiment, wherein lead wire groups are formed in a manner different from that of the present invention. In FIG. 10, reference numeral 3-1 denotes an input signal lead wire group. Similarly, reference numeral 3-2 denotes an output signal lead wire group, and reference numeral 8 denotes an LCD driver chip.

In order to effectively reduce the distance L, it is desirable that the number of lead wires of lead wire group 3-21 is made substantially equal to that of lead wires of lead wire group 3-22. For example, as regards the film carrier tape 1 shown in FIGS. 1 and 2, the number of lead wires of the lead wire group 3-21 and the number of lead wires of the lead wire group 3-22 are equal, i.e. 12 each.

By making the number of lead wires of lead wire group 3-21 substantially equal to that of lead wires of lead wire group 3-22, the number of lead wires to be arranged on the area between the device hole and the outer lead hole can be reduced to a minimum.

Besides, since the number of lead wires to be arranged on the area between the device hole and the outer lead hole can be reduced, a difference in length between the longest lead wire and the shortest lead wire can be reduced.

Since the difference in length between lead wires in each lead wire group is reduced, the signal delay time difference between lead wires can be reduced and high-speed operation can be effected.

Figure 3:
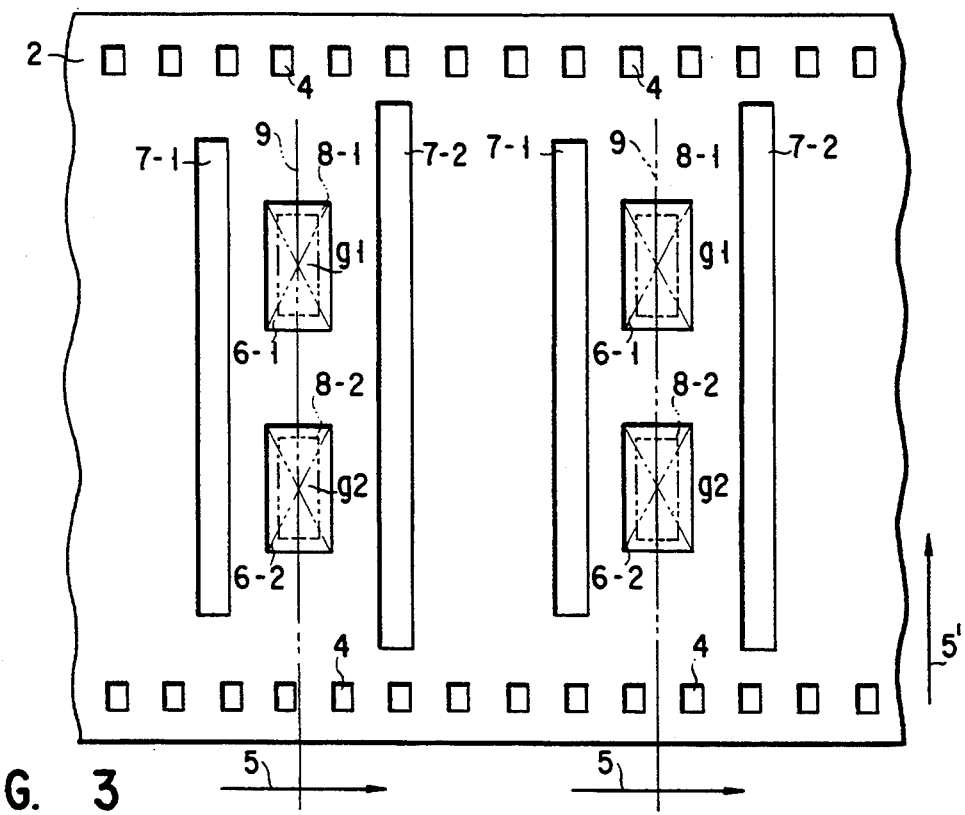
FIG. 3 is a plan view showing a base film of the film carrier tape shown in FIG. 1.

FIG. 3 is a plan view showing a base film of the film carrier tape shown in FIG. 1.

After chips are mounted on the film carrier tape 1, the tape is wounded around a reel in a roll form and the tape reel is stored. Thus, while the tape 1 is being wound around the reel, the chips are slightly bent. Since the tape 1 is wound around the reel in a roll form, the wound tape does not have a complete round shape, and has a varying radius of curvature. Thus, if the positions of mounted two chips are displaced from each other, the degree of deformation of chips varies and, as a result, a difference may occur in characteristics of the chips. In order to minimize non-uniformity in characteristics of chips due to the difference in degree of deformation of the chips, the chips are mounted along an imaginary line 9 extending in the width direction 5' in the present invention. This technique is illustrated shown in FIG. 3.

In FIG. 3, reference numerals g1 and g2 denote alignment centers of chips to be arranged within the device hole 8-1 and 8-2, respectively. In this embodiment, the alignment centers g1 and g2 are set at the centers of gravity of the device holes 8-1 and 8-2. The alignment centers g1 and g2 are located on the imaginary line 9, and the chips 8-1 and 8-2 are aligned with respect to the alignment centers g1 and g2.

With the structure shown in FIG. 3, even if the tape 1 is wound around the reel in a roll form, the chips have the same degree of deformation. The chips 8-1 and 8-2 can have the same degree of variation in, e.g. resistance value of in-chip wiring layers due to the degree of deformation of chips 8-1 and 8-2. Accordingly, the chips 8-1 and 8-2 can mutually cancel various factors which cause a difference in characteristics of chips, such as variation degree in resistance value due to the difference in degree of deformation. Therefore, the difference in characteristics of chips due to the difference in degree of deformation can be reduced to a minimum.

Figure 4:
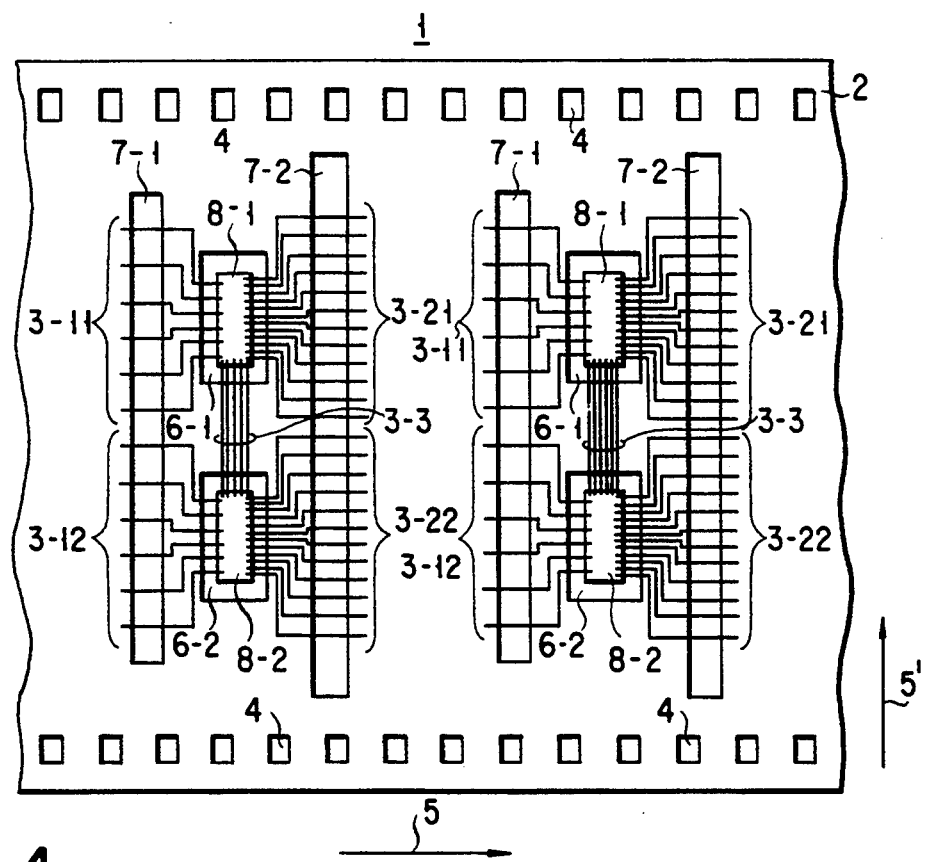
FIG. 4 is a plan view of a film carrier tape according to a second embodiment of the invention.

FIG. 4 is a plan view showing a film carrier tape according to a second embodiment of the invention.

As is shown in FIG. 4, in the film carrier tape according to the second embodiment, lead wire groups are arranged such that the lead wire pitch Pm on the film 2 is made equal to the inner lead pitch Pi.

In the second embodiment, both the pitch Pm and inner lead pitch Pi are set to a minimum value allowable from the standpoint of processing accuracy.

FIGS. 5A and 5B are enlarged views each showing one of device regions of tape. FIG. 5A shows a comparative example in which lead wire groups are formed without applying the technique of the present invention, and FIG. 5B shows an example (second embodiment) in which lead wire groups are formed by applying the technique of the present invention.

As is shown in FIG. 5A and FIG. 5B, in the case where the lead wire pitch Pm on the base film 2 is made equal to the inner lead pitch Pi, the lead wire groups 3-21 and 3-22 (or 3-2) are led from the chips 8-1 and 8-2 (or 8) onto the film 2 in the feed direction 5.

The lead wire groups 3-21 and 3-22 (or 3-2) are bent in the width direction 5' on the film 2. Further, the lead wire groups 3-21 and 3-22 (or 3-2) are bent in the feed direction 5 and led to the outer lead hole 7-2.

In the examples shown in FIGS. 5A and 5B, the number of output signal lead wires 3-21 and 3-22 (or 3-2) is set at 24.

As is shown in FIG. 5A, in the case where the present invention is not applied, 24 lead wires are arranged on the base film 2 between the device hole 6 and outer lead hole 7-2. When the lead wires are extended in a flaring fashion at a position of half the lead wires, half the wires, i.e. 12 wires, must be arranged with the pitch Pm.

However, in the present invention, as shown in FIG. 5B, 12 lead wires (first lead wire group 3-21) are arranged on the base film 2 between the first device hole 6-1 and outer lead hole 7-2, and 12 lead wires (second lead wire group 3-22) are arranged on the base film 2 between the second device hole 6-2 and outer lead hole 7-2. If these first and second lead wire groups 3-21 and 3-22 are arranged in flaring fashion at positions of half the wires 3-21 and half the wires 3-22, only six lead wires may be arranged with the pitch Pm.

Accordingly, the distance L between the device hole and outer lead hole can be reduced, and, like the first embodiment, the length L' in the feed direction required by the device can be reduced. In the second embodiment shown in FIG. 5B, like the first embodiment, the length L' in the feed direction required by each device could be reduced down to about 74%, for example, as compared to the tape carrier film shown in FIG. 5A.

Figure 6:
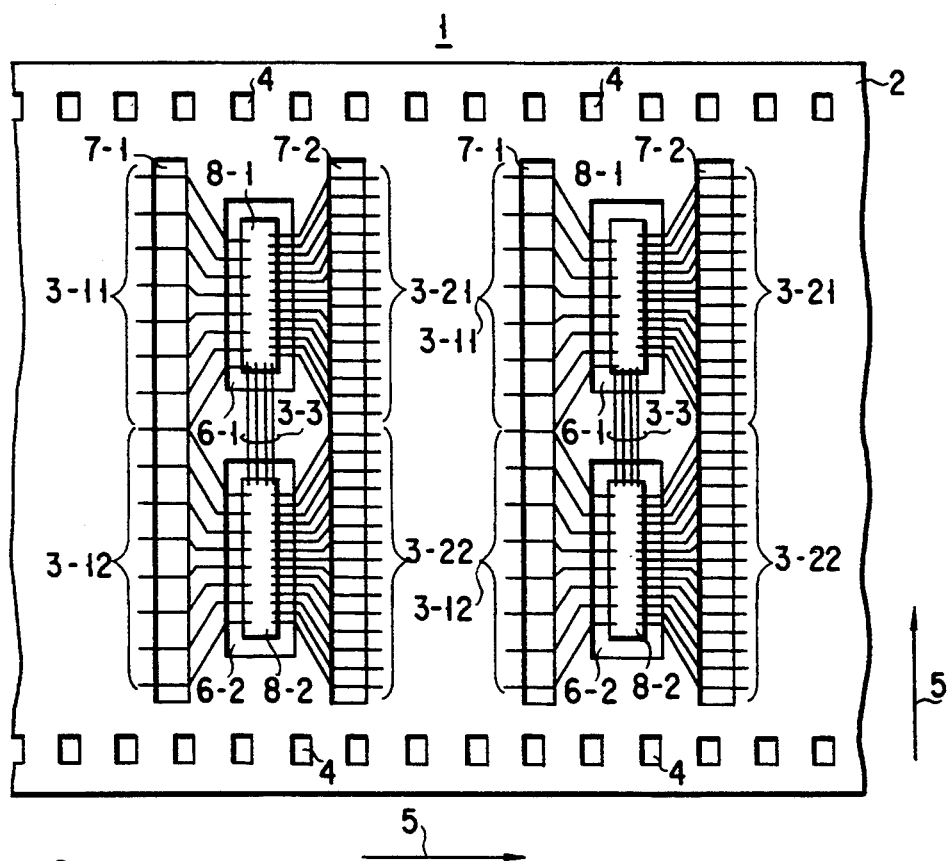
FIG. 6 is a plan view showing a film carrier tape according to a third embodiment of the invention.

FIG. 6 is a plan view of a film carrier tape according to a third embodiment of the present invention.

As is shown in FIG. 6, in the film carrier tape according to the third embodiment, lead wire groups are arranged on the basis of another example of the structure wherein the lead wire pitch Pm on the film 2 and the inner lead pitch Pi are made equal to each other.

According to the third embodiment, both the pitch Pm and inner lead pitch Pi are set to a minimum value allowable from the standpoint of processing accuracy.

Figure 7B:
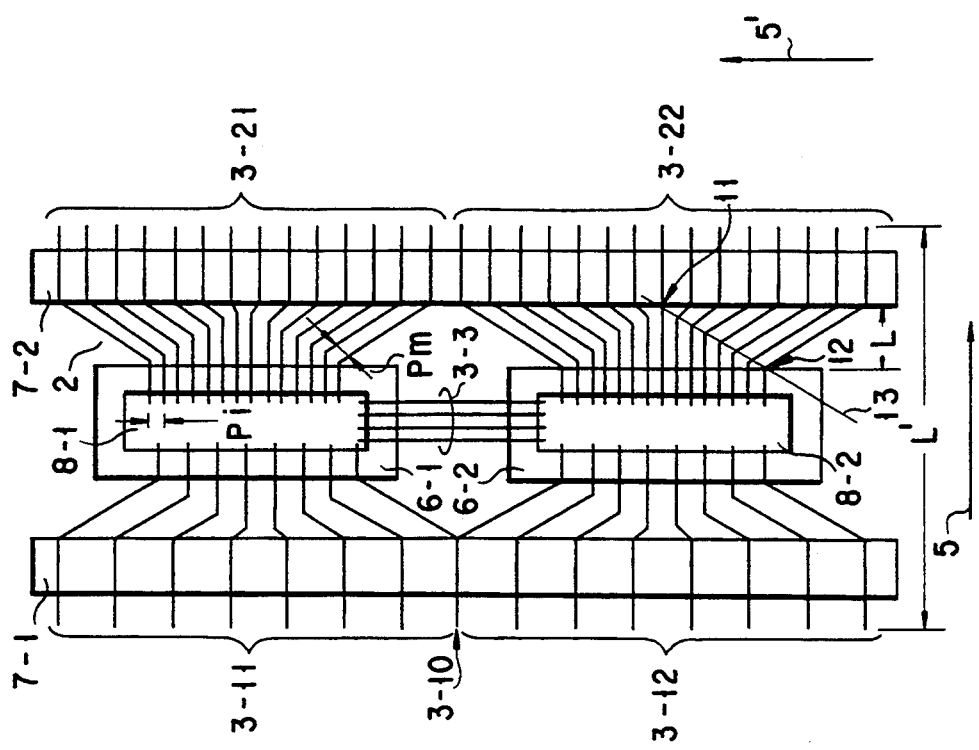
FIG. 7A and FIG. 7B are enlarged views of one of device regions of tape.
Figure 7A:
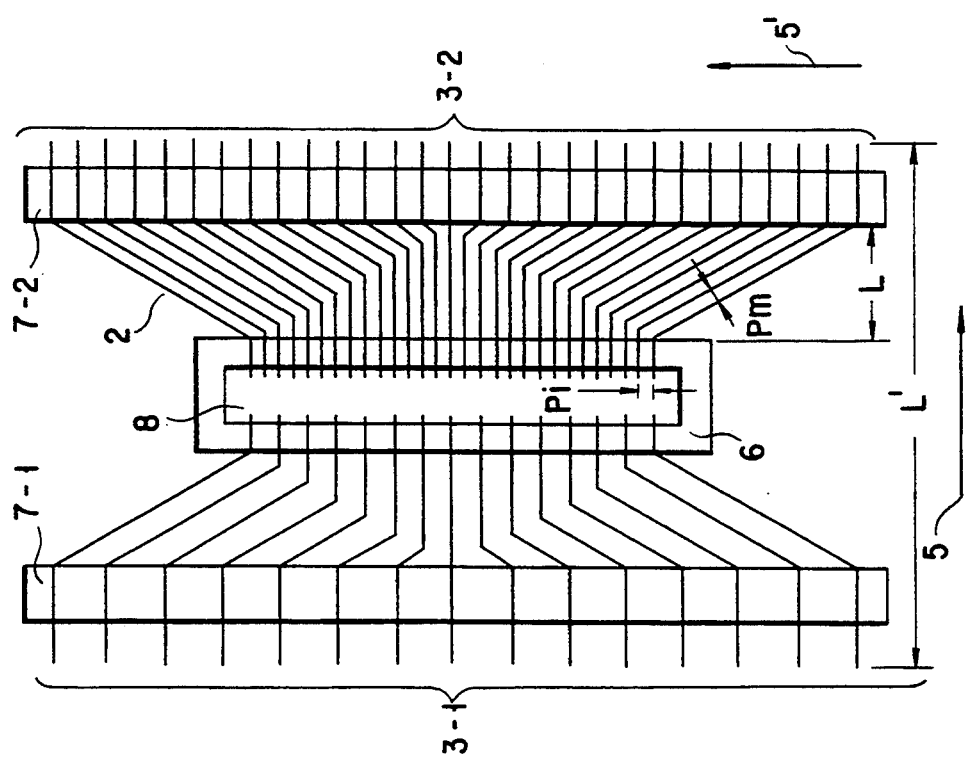

FIGS. 7A and 7B are enlarged views each showing one of device regions of tape. FIG. 7A shows a comparative example in which lead wire groups are formed without applying the technique of the present invention, and FIG. 7B shows an example (third embodiment) in which lead wire groups are formed by applying the technique of the present invention.

As is shown in FIGS. 7A and 7B, the lead wire groups 3-21 and 3-22 (or 3-2) are extended from the chip 8-1 and 8-2 (or 8) onto the film 2 in the feed direction 5. The lead wire groups 3-21 and 3-22 (or 3-2) are arranged on the film 2, for example, in the manner described below.

In particular, an imaginary line 13 is set to connect an approximate intersection 11 between a center line of the pad electrode mounting region and the outer lead hole 7-2, and an approximate intersection between an end portion of the pad electrode mounting region and the device hole 6-2.

The lead wire groups 3-21 and 3-22 (or 3-2) are bent in a direction different from the feed direction 5 at the intersections with the imaginary line 13 and are further bent in the feed direction 5 at points near the end portion of the outer lead hole 7-2. In the case of this arrangement, the distance L is determined on the basis of the relationship that the lead wire pitch Pm is equal to the inner lead pitch Pi.

FIGS. 7A and 7B, the number of output signal lead wires 3-21 and 3-22 (or 3-2) is set at 29.

When the present invention is not applied, as in the case of FIG. 7A, the distance L for meeting the relationship of Pm=Pi increases as the number of lead wires arranged on the film 2 between the device hole 6 and outer lead hole 7-2 increases.

However, as shown in FIG. 7B, when the present invention is applied, the number of lead wires arranged on the film 2 between the device hole 6-1 (6-2) and outer lead hole 7-2 can be reduced. Thus, the distance L between the device hole and outer lead hole can be reduced. Accordingly, like the first and second embodiments, the length L' in the feed direction required by one device can be reduced.

In the third embodiment shown in FIG. 7B, too, the length L' in the feed direction required by each device could be reduced down to about 74%, as compared to the tape carrier film shown in FIG. 7A.

In FIG. 7B, among the input signal lead wire groups, the lead wire indicated by reference numeral 3-10 is commonly connected to the chips 8-1 and 8-2. The lead wire 3-10 commonly connected to the chips 8-1 and 8-2 is divided on the base film 2 and electrically connected to the chips 8-1 and 8-2. The common lead wire 3-10 is used as power supply line such as VCC line or GND (ground) line.

The number of lead wires of the output signal lead groups is 29, i.e. an odd number. When the number of lead wires is an odd number, it is desirable to device the lead wires in a range of ±1 in order to decrease to a minimum the difference in number between first lead wires 3-21 and second lead wires 3-22.

In this embodiment, the number of first lead wires 3-21 is set at 14 and the number of second lead wires 3-22 is set at 15.

If the arrangement according to the third embodiment is adopted, it is possible to reduce the distance L without applying the present invention. FIG. 10 shows, as a comparative example, a film carrier tape adopting this arrangement.

As is shown in FIG. 11, the dimension of the device hole 6 in the width direction 5' is increased such that all lead wires 3-2 are arranged within a predetermined distance L. If this arrangement is adopted, it is possible to reduce the distance L, but it becomes necessary to increase the inner lead pitch Pi. That is, it is becomes possible to increase the intervals of electrode pads arranged on the chip. Consequently, the area of the chip increases and it is difficult to reduce the manufacturing cost.

According to the present invention, as shown in FIG. 7B, the distance L can be reduced without the need to increase the inner lead pitch Pi. Thus, an increase in chip area is not required.

Figure 8:
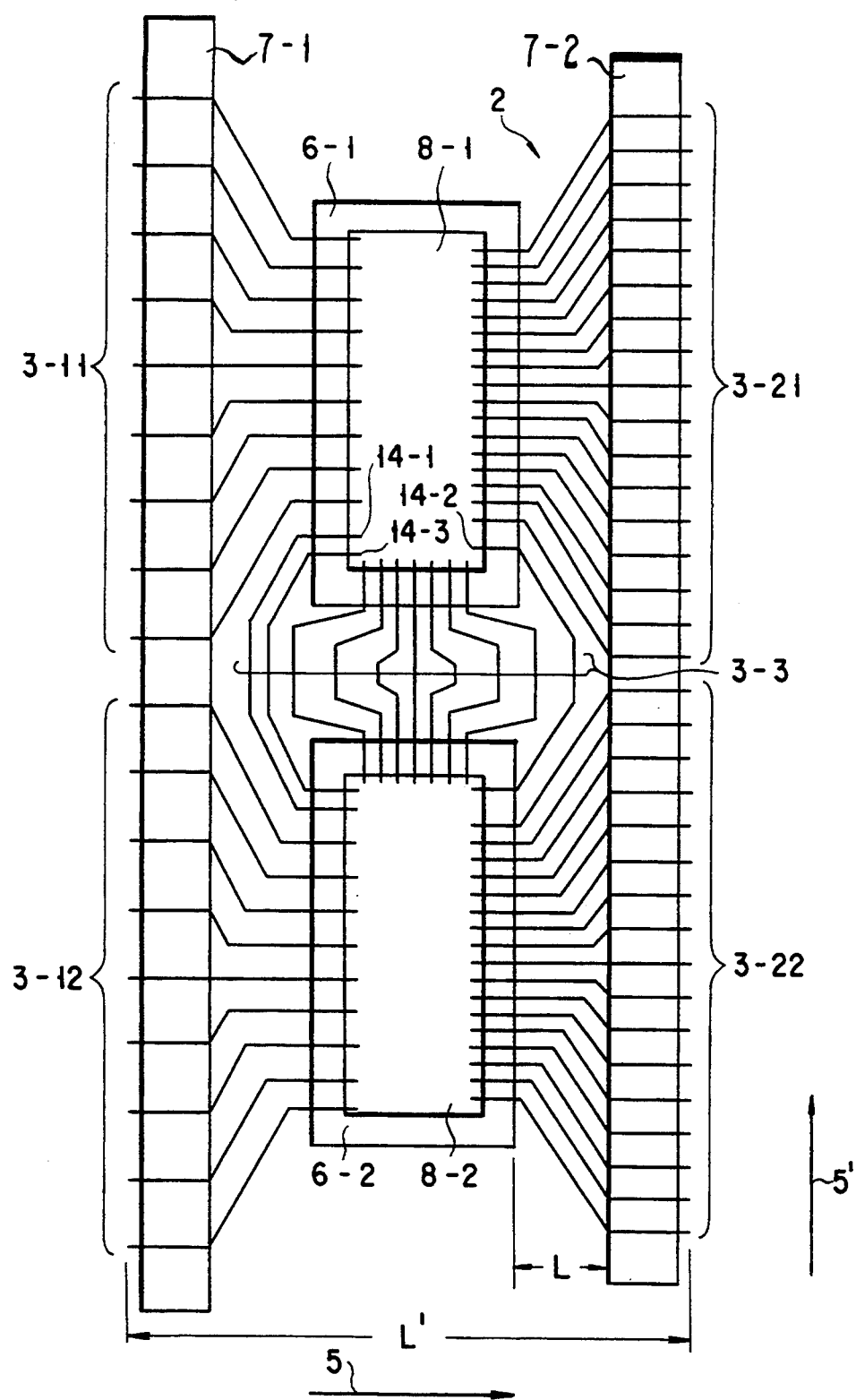
FIG. 8 is a plan view of a film carrier tape according to a modification of the invention.

FIG. 8 is a plan view of a film carrier tape according to a modification of the present invention. This modification relates to an arrangement of lead wire group 3-3 which connects chips 8-1 and 8-2. FIG. 8 is an enlarged view of one of device regions of tape according to this modification.

As is shown in FIG. 8, in order to increase the pitch of lead wires 3-3 connecting chips 8-1 and 8-2, in particular, the pitch on the base film 2, the lead wire group 3-3 may be extended on the film 2 between the device hole 6-1 (6-2) and the outer lead hole 7-1 (7-2).

In addition, in order to reduce the distance L' in the feed direction 5, the number of electrode pads (not shown) on the chip arranged in the feed direction 5 could be decreased and the electrode pads of decreased number arranged in a direction perpendicular to the feed direction. The lead wires connected to the pad electrodes are denoted by reference numerals 14-1, 14-2 and 14-3.

Figure 9:
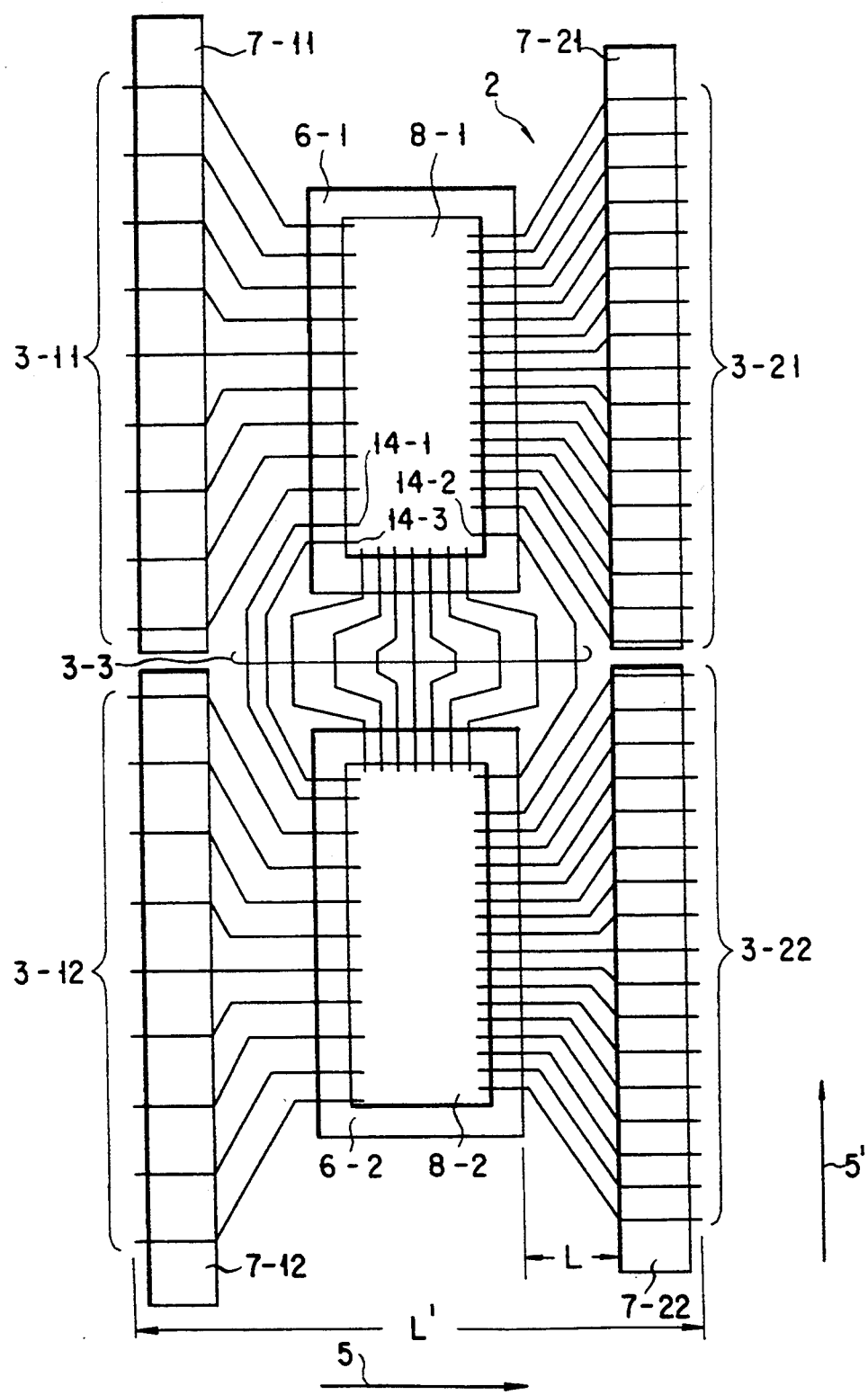
FIG. 9 is a plan view of a film carrier tape according to another modification of the invention.

FIG. 9 is a plan view of a film carrier tape according to another modification of the present invention.

This modification relates to an arrangement of outer lead holes. FIG. 9 is an enlarged view of one of device regions of tape according to this modification.

As is shown in FIG. 9, the outer lead hole 7-1 is divided into an outer lead hole 7-11 and another outer lead hole 7-12.

The first input lead wire group 3-11 extends over the outer lead hole 7-11, and the second input lead wire group 3-12 extends over the other outer lead hole 7-12.

Similarly, the outer lead hole 7-2 is divided into an outer lead hole 7-21 and another outer lead hole 7-22.

The first output lead wire group 3-21 extends over the outer lead hole 7-21, and the second output lead wire group 3-22 extends over the other outer lead hole 7-22.

In this manner, the outer lead hole may be divided into two or more holes. If the outer lead hole is divided into two or more holes in the width direction, the size of one outer lead hole can be reduced. If the size of one outer lead hole is reduced, deformation of the film tape 2 does not easily occur.

These modifications are applicable to any of the first to third embodiments.

In the above embodiments, the chip is divided into two chip components. However, the chip may be divided into three or more chip components.

Besides, in the above embodiments, the lead wires are arranged in columns in the width direction 5'. In this arrangement, the distance L in the feed direction 5 required by each device can be effectively reduced by applying the present invention. However, depending on the type of device, the lead wires may be arranged in columns in the feed direction 5 as well as the width direction 5'.

Furthermore, in the above embodiments, the film carrier tapes have been described as lead carriers. However, this invention is applicable to a lead frame obtained by punching or etching a single metal plate.

As has been described above, according to the present invention, at least two device holes are situated in the width direction, and an input or output signal lead wire group is arranged between these device holes, on the one hand, and one outer lead hole, on the other hand. Thereby, the number of lead wires arranged between one device hole and one outer lead hole can be reduced. Since the number of lead wires arranged between one device hole and one outer lead hole can be reduced, the amount of base member required by one device and, in particular, the distance L in the feed direction, can be reduced.

Therefore, according to the lead carrier of the present invention, the yield of devices per tape reel can be increased, and the manufacturing cost of devices can be decreased.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A lead carrier comprising:
   a base member comprised of an insulating film and having a predetermined feed direction and a predetermined width direction perpendicular to the feed direction;
   at least first and second electronic part arrangement portions including first and second holes in the base member such that said at least first and second electronic part arrangement portions are juxtaposed in the width direction;
   a conductor pattern arrangement portion, including a third hole, in the base member such that said conductor pattern is distanced from said first and second electronic part arrangement portions in the feed direction;
   a first lead wire group defined on the base member between said first electronic part arrangement portion and said conductor pattern arrangement portion, one end portion of said first lead wire group extending in the feed direction over said first hole, and the other end portion extending beyond said third hole;
   a second lead wire group defined on the base member between said second electronic part arrangement portion and said conductor pattern arrangement portion, one end portion of said second lead wire group extending in the feed direction over said second hole, and the other end portion extending beyond said third hole; and
   a third lead wire group defined on the base member between said first electronic part arrangement portion and said second electronic part arrangement portion, one end portion of said third lead wire group extending in the width direction over said first hole, and the other end portion extending over said second hole.

2. The lead carrier according to claim 1, wherein said one end portion of said first lead wire group projecting over said first hole is a connecting portion for connection with a first electronic part, and said other end portion thereof serves as an external terminal portion of said first electronic part,
   said one end portion of said second lead wire group projecting over said second hole is a connecting portion for connection with a second electronic part, and said other end portion thereof serves as an external terminal portion of said second electronic part, and
   said one end portion of said third lead wire group projecting over said first hole is connected to said first electronic part, and said other end portion thereof projecting over said second hole is connected to said second electronic part, and said third lead wire group functions as wiring for connecting said first and second electronic parts.

3. The lead carrier according to claim 2, wherein both said external terminal wire portion of said first electronic part and said external terminal wire portion of said second electronic part are arranged in columns in the width direction.

4. The lead carrier according to claim 2, wherein both said first and second electronic parts are semiconductor chips.

5. The lead carrier according to claim 4, wherein each of said semiconductor chips is a liquid crystal display driver.

6. The lead carrier according to claim 5, wherein each of said first and second lead wire groups functions as an output lead wire group of said liquid crystal display driver.

7. The lead carrier according to claim 1, wherein each of said first and second holes is a device hole, and said third hole is an outer lead hole.

8. The lead carrier according to claim 1, wherein the number of lead wires constituting said first lead wire group is substantially equal to that of lead wires constituting said second lead wire group.

9. The lead carrier according to claim 1, wherein the first lead wire group is arranged in a flaring fashion towards said conductor pattern arrangement portion with respect to a position of half the lead wires of the first lead wire group arranged in the width direction, and the second lead wire group is arranged in a flaring fashion towards said conductor pattern arrangement portion with respect to a position of half the lead wires of the second lead wire group arranged in the width direction.

10. The lead carrier according to claim 1, further comprising:

engaging means, provided along both edge portions of the base member extending in the feed direction, for engaging feed claws of a feed device for feeding the base member with said base member.

11. The lead carrier according to claim 10, wherein said engaging means comprises perforated holes formed in the base member at regular intervals.

12. The lead carrier according to claim 11, wherein said perforated holes are sprocket holes.

13. A lead carrier comprising:

a base member having a predetermined feed direction and a predetermined width direction perpendicular to the feed direction;

at least first and second electronic part arrangement portions defined in the base member such that said at least first and second electronic part arrangement portions are juxtaposed in the width direction, said first and second electronic part arrangement portions having first and second electronic part alignment centers, respectively, said first and second electronic alignment centers being located on an imaginary line extending in the width direction;

a conductor pattern arrangement portion defined in the base member such that said conductor pattern is distanced from said first and second electronic part arrangement portions in the feed direction;

a first lead wire group defined on the base member between said first electronic part arrangement portion and said conductor pattern arrangement portion;

a second lead wire group defined on the base member between said second electronic part arrangement portion and said conductor pattern arrangement portion; and a third lead wire group defined on the base member between said first electronic part arrangement portion and said second electronic part arrangement portion.

* * * * *